United States Patent
Hughes

(12) 
(10) Patent No.: US 6,522,209 B2
(45) Date of Patent: Feb. 18, 2003

(54) OSCILLATOR AVERAGING PHASE SHIFT GENERATOR

(75) Inventor: Billy Joe Hughes, Berwyn, IL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/860,101

(22) Filed: May 17, 2001

(65) Prior Publication Data
US 2002/0171495 A1 Nov. 21, 2002

(51) Int. Cl.[7] .................................................. H03L 7/07

(52) U.S. Cl. .............................. 331/47; 331/50; 331/55; 331/74

(58) Field of Search .............................. 331/46, 47, 55, 331/50, 174, 40, 48, 37, 77, 34; 327/175, 141; 323/282, 288, 351

(56) References Cited

U.S. PATENT DOCUMENTS 5,455,542 A * 10/1995 Spence et al. ......... 331/116 FE

* cited by examiner

Primary Examiner—Robert Pascal
Assistant Examiner—Kimberly E Glenn
(74) Attorney, Agent, or Firm—W. Daniel Swayze, Jr.; W. James Brady; Frederick J. Telecky, Jr.

(57) ABSTRACT

Two oscillators, such as in two pulse width modulator circuits of DC to DC power converters, are maintained in synchronization and at a predetermined phase shift from one another by a circuit incorporating a comparator. A sawtooth signal output from the master oscillator is fed to one comparator input while the sawtooth signal is filtered and applied to the second input of the comparator to generate an approximately 180° phase shift turn-on at the output of the comparator that is fed through a driver circuit to an input of a second oscillator. By insuring that the faster operating oscillator is the master, the slave oscillator will be triggered by the signal from the master.

13 Claims, 1 Drawing Sheet

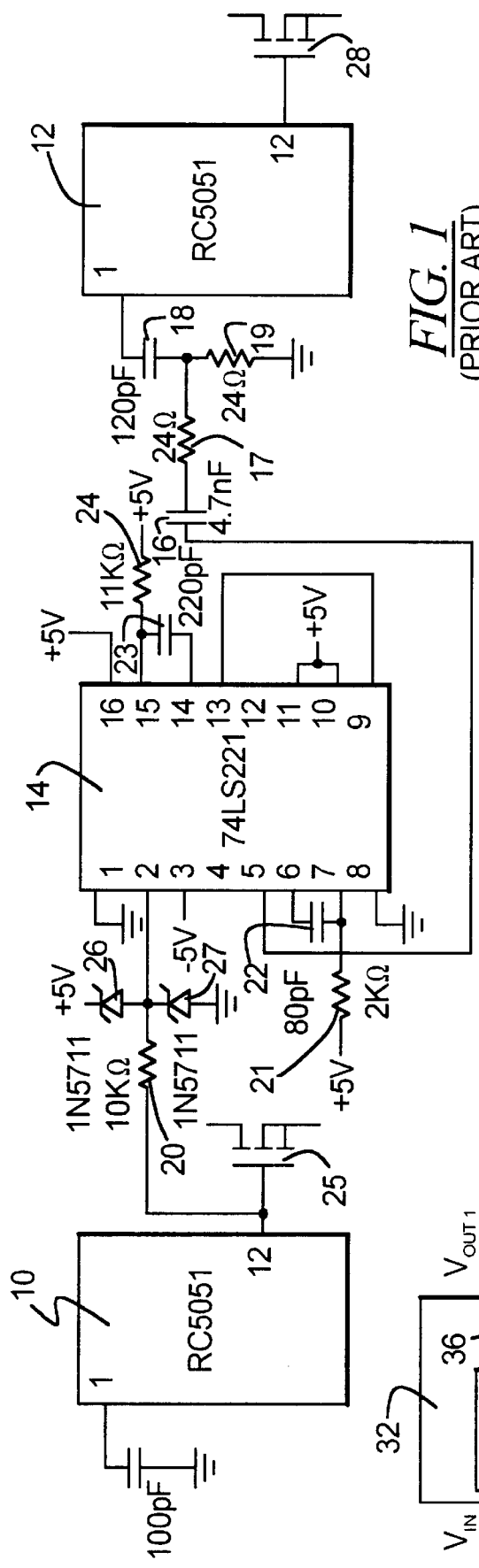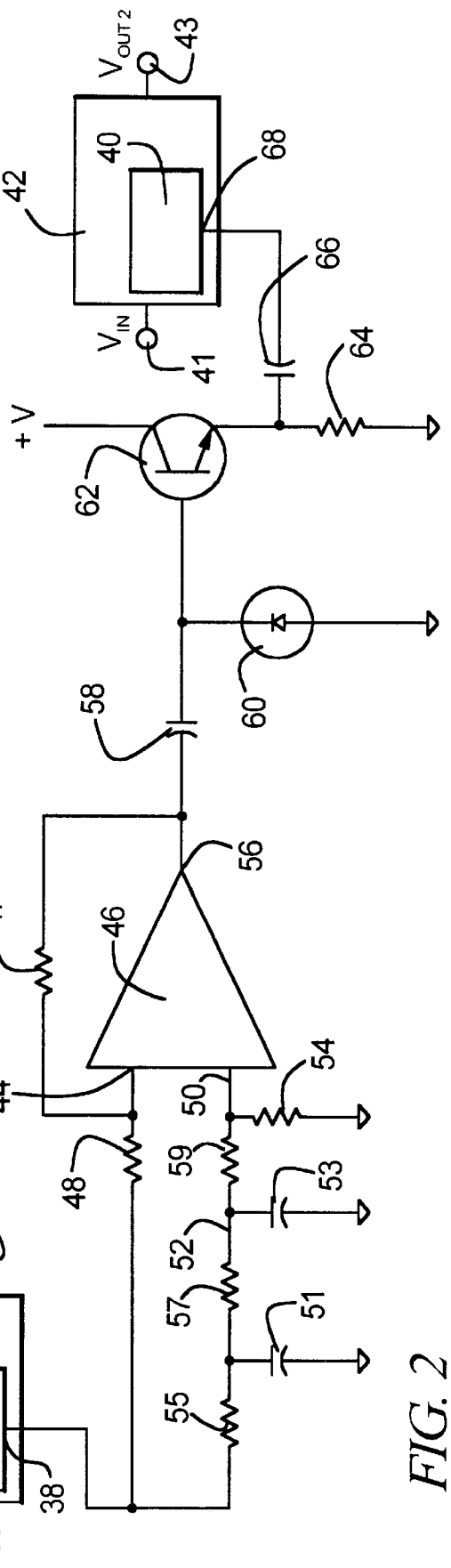

OSCILLATOR AVERAGING PHASE SHIFT GENERATOR

BACKGROUND OF THE INVENTION

1. Field of the Invention

The present invention relates generally to an electrical circuit for synchronizing and phase shifting two oscillators, for example, oscillators used in pulse width modulation circuits.

2. Description of the Related Art

Electronic devices, such as computers, use a power supply unit to supply power to other internal components of the device. The different components often require different supply voltages which generally must be generated from a single voltage of the power supply unit. The voltage supplied by the power supply unit of the electronic device is often a DC voltage such as 12 volts or 5 volts and this DC voltage must be converted to other DC voltages which may be either higher or lower for use by certain of the components. In one example, the voltage of the power supply unit is to be converted to 3.3 volts and 2.5 volts for components in the device. It is also necessary to provide multiple voltage converters when multiple high current components, such as multiple processors, are used.

One approach to converting a DC voltage to a second DC voltage makes use of pulse width modulation (PWM). In pulse width modulation, the input voltage is turned on and off by a repetitive pulse having a period proportionate to the reduction in voltage desired. The pulsed signal is forwarded to an averager to achieve the output voltage. For example, a 5 volt DC level may be converted to a 2.5 volt level by using a pulse width that is on 50% of the time and off 50% of the time and which is averaged to achieve the 2.5 volt level. A higher voltage may be achieved by having a proportionately higher on time for the pulsed signal, and conversely, a lower voltage may be achieved by a shorter on time for the pulsed signal.

An oscillator is used to generate the periodic signal in a pulse width modulator circuit, the PWM being controlled by a feedback circuit that adjusts the pulse width to produce the desired output level.

Where two or more output voltage levels are required, two pulse width modulation circuits may be utilized. When using multiple pulse width modulation controllers in a common switch mode power supply, it is desirable to synchronize the individual oscillators to a common switching frequency. This helps prevent electrical noise generated by sum and difference beat frequencies. In addition, the oscillators should be phase shifted apart to prevent large input current pulses caused by simultaneous turn-on of each power pulse.

An example of a circuit for synchronizing two oscillators is illustrated in FIG. 1. A first oscillator 10 is synchronized and phase locked to a second oscillator 12 by a synchronizing circuit utilizing an integrated circuit chip 14 and a variety of components including precision capacitors and resistors. In particular, the oscillator 10 begins a switching cycle and in doing so emits a signal from an output on pin 12 that is connected to a gate of a FET 25. The signal passes through a resistor 20 and between schottky diodes 26 and 27 to an input pin 2 of the chip 14. This triggers a one-shot in the chip 14. The one shot has been set, using precision capacitors and the like, to generate a pulse of a length of approximately one half of the switching period of the oscillator 10. The falling edge of the pulse triggers a second one-shot in the chip 14, which produces a very short pulse. This short pulse is connected to the timing ramp input of the slave oscillator 12 through capacitor 16 and 18 and resistors 17 and 19. The second oscillator 12, upon receiving the short pulse, starts a new switching cycle, which outputs a pulse on its pin 12 to the gate of a FET 28. The pulse lengths of the two one-shots in the chip 14 are set by the capacitor 22 and 23 and the resistors 21 and 24.

SUMMARY OF THE INVENTION

An object of the present invention is to synchronize two oscillators together and to offset, or phase shift, the timing signals of the oscillators from one another.

A further objective of the present invention is to provide a synchronization and phase shift circuit for oscillators using only a few non-precision parts.

The present invention achieves these and other objectives by providing a filter to turn a sawtooth signal output from a first oscillator into a DC voltage that is used to identify a phase shift point for the second oscillator. The present circuit utilizes a comparator with feedback hysteresis, a filter, and a synchronization injector to link the master oscillator output to the slave oscillator input.

The present invention achieves a synchronization between the pulses of the master and slave oscillators and introduces a phase shift, such as 180°, between these pulses to avoid current surges resulting from simultaneous firing of the two oscillators. The present circuit does not require the use of precision components and uses fewer components and lower cost components than prior circuits.

BRIEF DESCRIPTION OF THE DRAWINGS

FIG. 1 is a circuit diagram of a prior art oscillator synchronization and phase shift circuit; and FIG. 2 is a circuit diagram of an oscillator synchronization and phase shift generator according to the present invention.

DETAILED DESCRIPTION OF THE PREFERRED EMBODIMENTS

In FIG. 2, a voltage input lead 30 of a pulse width modulation circuit 32 receives an input voltage $V_{IN}$ such as from a power supply of an electronic device for conversion into a first output voltage $V_{out\ 1}$ 34. In one example, the voltage input $V_{IN}$ 30 is a 5 volt DC voltage level which is converted into the first voltage output level $V_{out\ 1}$ 34 of 2.5 volts. A second pulse width modulator 42 also receives the input voltage $V_{IN}$ at 41 and converts it into a second output voltage $V_{out\ 2}$ at 43 of 3.3 volts. The pulse width modulator 32 includes an oscillator 36 which is utilized to generate the pulses for the voltage conversion. The oscillator 36 has a capacitor timing output 38 from which is emitted a sawtooth signal. It is this sawtooth signal which is utilized in the oscillator synchronization circuit of the present invention. The oscillator 36 is designated as the master oscillator. The second pulse width modulator 42 also has an oscillator 40, designated here as a slave oscillator.

The sawtooth oscillator signal from the output 38 of the master oscillator 36 is set to a slightly higher frequency than the slave oscillator 40 and is utilized as a master signal. A phase shifted timing signal is generated by the present circuit to lock the slave oscillator 40 of the second pulse width modulator 42 to the master unit. To generate this timing signal, the master sawtooth signal is connected to an input 44 of a comparator circuit 46 through a resistor 48. The other input 50 of the comparator 46 is connected to a filtered DC average voltage of the master sawtooth signal. This filtered average voltage is generated by feeding the master sawtooth signal through a filter 52 which in the illustrated embodiment is a two pole low pass filter 52. In particular, the filter 52 includes capacitors 51 and 53 and a resistor 54 connected to ground and resistors 55, 57 and 59 in the signal path.

The point of coincidence of the two input signals to the inputs 44 and 50 of the comparator 46 will occur at approximately half way up the ramp of the sawtooth signal, or at approximately 180° of phase shift. The coincidence of the signals triggers the comparator 46 to trip over and switch its output 56 to positive. The comparator 46 includes a hysteresis feed back loop with a resistor 47 between the output 56 and the input 44.

The output 56 is coupled through a capacitor 58 to a drive device 62, here a transistor, that serves as a synchronization injector. The synchronization injector 62 feeds a signal to the capacitor timing input 68 of the second, or slave, oscillator 40. The synchronization injector circuit includes a diode 60 to prevent reverse bias of a transistor 62 and a resistor 64 and capacitor 66 at the emitter lead of the transistor 62. A signal from the comparator output 56 to the base of the transistor 62 turns the transistor on, supplying current to the resistor 64. This leads to a voltage spike across the resistor 64 that is transferred by the capacitor 66 to the input 68 of the oscillator 40.

The resulting output of the oscillator 40 is a sawtooth wave form with a superimposed voltage spike where the sawtooth truncates at the spike. Thus, the resulting output from the comparator 46 is coupled to and level shifted to be superimposed on the sawtooth ramp of the slave oscillator, which locks the master and slave oscillators 36 and 40 together but at a phase shift from one another.

The use of a synchronization injector transistor 62 is not required in every instance. By choosing a comparator having sufficient output current capacity, the comparator output may be used to drive the input of the slave oscillator without an intervening active element. Such a comparator is more costly, however, and its performance is critical to the circuit.

On the other hand, by using the transistor 62 of the illustrated preferred embodiment, triggering of the slave oscillator is assured, even with the use of a standard, low cost, comparator.

It is foreseen to utilize other types of active elements as synchronization injectors in place of the transistor 62.

The degree of phase shift can be controlled by either attenuating or amplifying the DC averaged signal of the master oscillator with either an active or a passive control. This can be accomplished by trimming the resistors of the voltage divider at the input 50 of the comparator.

Thus, the present synchronization circuit enables the utilization of multiple pulse width modulation controllers in a common switched mode power supply in which individual oscillators are synchronized to a common switching frequency and are phase shifted apart to prevent electrical noise generated by the sum and difference beat frequencies. The present invention also prevents large input current pulses by preventing simultaneous turn-on of each power pulse of the respective oscillators.

It is foreseen to incorporate the present synchronization circuit into oscillator controls having multiple slave oscillators. A plurality of voltages could thereby be generated.

The present invention provides an inherently self adjusting phase shift, linked to the master oscillator frequency and maximum and minimum ramp voltages. Thus, the phase shift is determined by the master oscillator.

By sawtooth averaging, the phase shift is inherently self adapting to the amplitude of the master oscillators ramp signal to create a well defined phase shift. The degree of phase shift is easily set to any phase needed. The implementation according to the present invention is a low cost, low parts count circuit utilizing non-precision components. Accordingly, the present invention is simple, inexpensive and elegant in its simplicity.

The slave oscillator is set so that if it were permitted to free run it would do so at a slightly lower frequency than the master oscillator. The synchronize pulse of the present circuit triggers the slave oscillator sooner than it would have in its free running state so that it is approximately 180° out of phase with the master oscillator and maintained in synchronization.

As a result of the fewer parts for the present invention and the lack of critical components, a lower failure rate is realized. Less expensive components are utilized than the precision components previously required in such an application.

The present invention may be used to supply power to multiple processor systems in a computer, dual voltage digital signal processors, or two synchronized oscillators in a variety of applications.

In one application, a 5 volt power supply output is converted to a regulated 2.5 volt level by the master pulse width modulator and to a regulated 3.3 volt level by the slave pulse width modulator.

The use of a filter to turn a sawtooth into a DC signal to provide an approximately 180° phase shift point is thus provided in the present invention.

Although other modifications and changes may be suggested by those skilled in the art, it is the intention of the inventor to embody within the patent warranted hereon all changes and modifications as reasonably and properly come within the scope of their contribution to the art.

I claim:

1. An oscillator synchronization and phase shift circuit for connection between first and second oscillators, comprising:
    a comparator having first and second inputs, said first input of said comparator connected to receive a sawtooth signal from the first oscillator;
    a filter circuit having an input connected to receive the sawtooth signal from the first oscillator, said filter circuit having an output connected to said second input of said comparator; and
    an output of said comparator connected to an input of the second oscillator.

2. An oscillator synchronization and phase shift circuit as claimed in claim 1, further comprising:
    an active element connected between said output of said comparator and said input of said second oscillator.

3. An oscillator synchronization and phase shift circuit as claimed in claim 1, wherein said filter at said second input of said comparator is a low pass filter.

4. An oscillator synchronization and phase shift circuit as claimed in claim 3, wherein said filter is a two pole low pass filter.

5. An oscillator synchronization and phase shift circuit as claimed in claim 2, wherein said active element includes a transistor having its base connected to the output of said comparator and an output connected to said input of said second oscillator through a pulse transfer.

6. An oscillator synchronization and phase shift circuit as claimed in claim 1, further comprising:

hysteresis feedback connected between said output of said comparator and one of said first and second inputs of said comparator.

7. Master and slave oscillators connected in synchronization, comprising:

a master oscillator having a sawtooth wave output and operating at a first frequency;

a slave oscillator having an input and operating at a frequency slower than said first frequency;

a synchronization circuit connected between said sawtooth output of said master oscillator and said input of said slave oscillator, said synchronization circuit including:

a comparator having a first input connected to said sawtooth wave output of said master oscillator;

a filter having an input connected to said sawtooth wave output of said master oscillator;

a second input of said comparator connected to an output of said filter;

an output of said comparator connected to said input of said slave oscillator.

8. A master slave oscillator as claimed in claim 7, further comprising:

a driver connected between said output of said comparator and said input of said slave oscillator.

9. A dual output DC to DC voltage converter, comprising:

a first pulse width modulator circuit having a voltage input and including a first oscillator connected to generate a first voltage output, said oscillator including a sawtooth wave signal output;

a filter connected to said sawtooth wave output of said first oscillator;

a comparator having first and second inputs, said first input of said comparator being connected to said sawtooth wave output of said first oscillator and said second input of said oscillator being connected to an output of said filter; and a second pulse width modulation circuit having an input connected to receive said input voltage and having an output to produce a second output voltage, said second pulse width modulation circuit including a second oscillator, said second oscillator including a control input, said control input of said second oscillator being connected to receive an output signal from said comparator.

10. A dual output DC to DC voltage converter as claimed in claim 9, wherein said first output voltage of said first pulse width modulator is a lower voltage level than said second output voltage of said second pulse width modulator.

11. A dual two output DC to DC voltage converter as claimed in claim 9, further comprising:

a transistor driver circuit connected between said output of said comparator and said control input of said second oscillator, said transistor driver circuit including:

a transistor having a base connected to receive a signal from said comparator output, an output lead connected across a resistor and a capacitor connected between said resistor and said output lead of said transistor at a first end and to said control input of said second oscillator at a second end, and a diode connected between said base of said transistor and ground.

12. A method for synchronizing and phase shifting first and second oscillators, comprising the steps of:

averaging an output of the first oscillator to produce an averaged signal;

comparing the output of the first oscillator to the averaged signal; and triggering the second oscillator when the output of the first oscillator approximately equals the averaged signal.

13. A method of synchronizing and phase shifting first and second voltage converters, comprising the steps of:

averaging an oscillator output of the first voltage converter to produce an averaged signal;

comparing the oscillator output of the first voltage converter to the averaged signal; and triggering the second voltage converter when the oscillator output of the first voltage converter approximately equals the averaged signal.

* * * * *